(12) United States Patent
Mandelbaum et al.

(10) Patent No.: US 9,601,895 B2
(45) Date of Patent: Mar. 21, 2017

(54) ULTRA FAST SEMICONDUCTOR LASER

(71) Applicant: BAE Systems Information and Electronic Systems Integration Inc., Nashua, NH (US)

(72) Inventors: Idan Mandelbaum, Fair Lawn, NJ (US); Konstantinos Papadopoulos, Chevy Chase, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 19 days.

(21) Appl. No.: 14/653,525

(22) PCT Filed: Oct. 17, 2014

(86) PCT No.: PCT/US2014/061106
§ 371 (c)(1),
(2) Date: Jun. 18, 2015

(87) PCT Pub. No.: WO2015/058070
PCT Pub. Date: Apr. 23, 2015

(65) Prior Publication Data
US 2015/0303651 A1    Oct. 22, 2015

Related U.S. Application Data

(60) Provisional application No. 61/892,769, filed on Oct. 18, 2013.

(51) Int. Cl.
*H01S 3/10* (2006.01)
*H01S 3/094* (2006.01)
(Continued)

(52) U.S. Cl.
CPC .. *H01S 3/094076* (2013.01); *H01S 3/094092* (2013.01); *H01S 3/1062* (2013.01);
(Continued)

(58) Field of Classification Search
CPC ......... H01S 3/094076; H01S 3/094092; H01S 3/1062; H01S 5/34; H01S 5/125;
(Continued)

(56) References Cited

U.S. PATENT DOCUMENTS

| | | | | |
|---|---|---|---|---|
| 4,525,687 A | * | 6/1985 | Chemla | B82Y 20/00 257/189 |
| H000882 H | * | 1/1991 | Fox | H01S 3/073 372/62 |

(Continued)

FOREIGN PATENT DOCUMENTS

GB    2093630    9/1982

OTHER PUBLICATIONS

PCT/US14/061106, ISR mailed on Feb. 10, 2015.
(Continued)

*Primary Examiner* — Yuanda Zhang
(74) *Attorney, Agent, or Firm* — Daniel J. Long; Sand & Sebolt, LPA

(57) ABSTRACT

A laser system includes first and second mirrors, a semiconductor laser and a high frequency pulse generator. The semiconductor laser generates optical power within an optical cavity and reflects the optical power between the first mirror and second mirrors. The optical power has a frequency of $f_{original\text{-}laser}$. The high frequency pulse generator generates a high frequency pulse with a rise time greater than an optical cycle of the optical power within the optical cavity and directly impinges the high frequency pulse on the optical power within the optical cavity. Impinging the high frequency pulse on the optical power within the optical cavity causes a frequency shift of the optical power to generate a final laser frequency that is greater than $f_{original\text{-}laser}$ as well as beyond a frequency band of the (Continued)

second mirror to cause a final laser to be emitted past the second mirror and from the semiconductor laser.

20 Claims, 2 Drawing Sheets

(51) Int. Cl.
| | |
|---|---|
| *H01S 5/06* | (2006.01) |
| *H01S 3/106* | (2006.01) |
| *H01S 5/0625* | (2006.01) |
| *H01S 5/125* | (2006.01) |
| *H01S 5/34* | (2006.01) |
| *H01S 5/02* | (2006.01) |
| *H01S 5/12* | (2006.01) |

(52) U.S. Cl.
CPC ........ *H01S 5/0608* (2013.01); *H01S 5/06256* (2013.01); *H01S 5/125* (2013.01); *H01S 5/34* (2013.01); *H01S 5/021* (2013.01); *H01S 5/0609* (2013.01); *H01S 5/12* (2013.01)

(58) Field of Classification Search
CPC ...... H01S 5/06256; H01S 5/0608; H01S 5/12; H01S 5/021; H01S 5/0609
See application file for complete search history.

(56) References Cited

U.S. PATENT DOCUMENTS

| | | | |
|---|---|---|---|
| 5,020,064 A | 5/1991 | Mizushima et al. | |
| 5,428,226 A | 6/1995 | Adams | |
| 6,002,697 A | 12/1999 | Govorkov et al. | |
| 6,330,262 B1 * | 12/2001 | Burrows | H01S 3/0632 372/39 |
| 6,580,733 B1 * | 6/2003 | Peale | H01S 5/0625 372/18 |
| 2005/0163186 A1 | 7/2005 | Petersen | |
| 2006/0161608 A1 | 7/2006 | Bae | |
| 2014/0334763 A1 * | 11/2014 | Holzer | G02F 1/3513 385/1 |
| 2015/0003487 A1 * | 1/2015 | Gao | H01S 3/1062 372/107 |

OTHER PUBLICATIONS

Shcheslavskiy, V; (2003) Novel Ultrafast Laser Sources: Applicaitons in Nonlinear Optical Microscopy, [Retrieved Dec. 18, 2014], Available from ProQuest Dissertations & Theses Full Fext: The Sciences and Engineering Collection (305282971). Retreived from http://search.proquest.com/docview/305282971?accountid=142944.

S.C. Wilks, J.M. Dawson, W.B. Mori, "Frequency Up-Conversion of Electromagnetic Radiation With Use of an Overdense Plasma," Physical Review Letters vol. 61, No. 3, pp. 337-340, 1988.

* cited by examiner

ULTRA FAST SEMICONDUCTOR LASER

BACKGROUND OF THE INVENTION

1. Field of Invention

The current invention relates generally to apparatus, systems and methods for generating lasers. More particularly, the apparatus, systems and methods relate to generating lasers in a semiconductor. Specifically, the apparatus, systems and methods provide for generating an ultra-fast high power semiconductor laser.

2. Description of Related Art

Historically, a laser diode is electrically a P-I-N diode. The active region of the laser diode is in the intrinsic (I) region, and the carriers, electrons and holes, are pumped into it from the N and P regions respectively. While initial diode laser research was conducted on simple P-N diodes, many modern lasers use the double-heterostructure implementation, where the carriers and the photons are confined in order to maximize their chances for recombination and light generation. Unlike a regular diode used in electronics, the goal for a laser diode is that all carriers recombine in the I region, and produce light. Thus, laser diodes are often fabricated using direct bandgap semiconductors. The laser diode epitaxial structure is grown using one of the crystal growth techniques, usually starting from an N doped substrate, and growing the I doped active layer, followed by the P doped cladding, and a contact layer. The active layer most often consists of quantum wells, which provide lower threshold currents and higher efficiency.

Laser diodes form a subset of the larger classification of semiconductor p-n junction diodes. Forward electrical bias across the laser diode causes the two species of charge carrier—holes and electrons— to be "injected" from opposite sides of the p-n junction into the depletion region. Holes are injected from the p-doped, and electrons from the n-doped, semiconductor. (A depletion region, devoid of any charge carriers, forms as a result of the difference in electrical potential between n- and p-type semiconductors wherever they are in physical contact.) Due to the use of charge injection in powering most diode lasers, this class of lasers is sometimes termed "injection lasers," or "injection laser diode" (ILD). As diode lasers are semiconductor devices, they may also be classified as semiconductor lasers. Either designation distinguishes diode lasers from solid-state lasers.

What is needed is a better semiconductor laser.

SUMMARY

One aspect of an embodiment of the invention includes a laser system that includes first and second mirrors, a semiconductor laser and a high frequency pulse generator. The semiconductor laser generates optical power within an optical cavity and reflects the optical power between the first and second mirrors. The optical power has a frequency of $f_{original-laser}$. The high frequency pulse generator generates a high frequency pulse with a rise time greater than an optical cycle of the optical power within the optical cavity and directly impinges the high frequency pulse on the optical power within the optical cavity. Impinging the high frequency pulse on the optical power within the optical cavity causes a frequency shift of the optical power to generate a final laser frequency that is greater than $f_{original-laser}$ as well as beyond a frequency band of the second mirror to cause a final laser to be emitted past the second mirror and from the semiconductor laser.

Another embodiment may provide for a method for operating a semiconductor laser having 100% mirrors and a cavity having an active region. The method begins by generating optical power within the active region with the optical power having an initial frequency of $f_{initial}$. Next, an ultra-short optical pulse is applied to the active region to provide enough plasma density, on ionization in the cavity, to cause a frequency shift of the optical power within the active region and to cause the semiconductor to emit an emitted laser. The frequency shift is a frequency of $f_{plasma}$, and the frequency of the emitted laser has a frequency of $f_{initial}+f_{plasma}$.

BRIEF DESCRIPTION OF SEVERAL VIEWS OF THE DRAWINGS

One or more example embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa, Furthermore, elements may not be drawn to scale.

Similar numbers refer to similar parts throughout the drawings.

DETAILED DESCRIPTION

Figure 1:
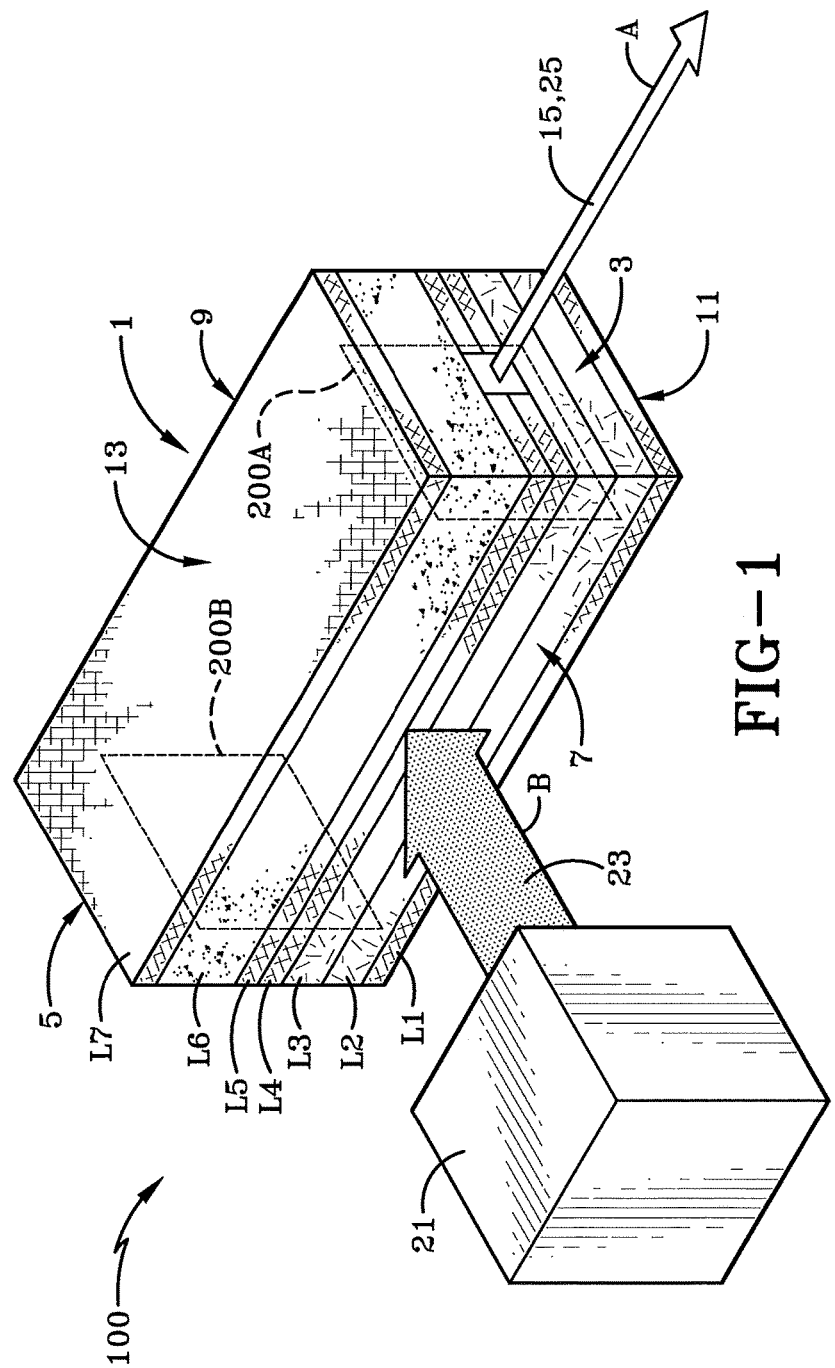
FIG. 1 illustrates an example embodiment of a laser system that includes a semiconductor laser and a high frequency pulse generator.

FIG. 1 illustrates an example perspective view of a semiconductor laser 1 used in an example embodiment of a laser system 100. The semiconductor laser 1 could be one of a variety of semiconductor lasers as appreciated by those of ordinary skill in the art. The example semiconductor laser 1 of FIG. 1 has a front side 3, a back side 5, a left side 7 a right side 9 a bottom 11 and a top 13. The semiconductor laser 1 is formed on a silicon wafer by depositing various layers L1-L7 materials to build up the laser 1. Those of ordinary skill in the art understand that various P-doped layer(s), N-doped layer(s), metal layer(s), various semiconductor layer(s), dopants and the like for the layers L1-L7. Of course, in other configurations there may be more or less than the seven layers illustrated in example FIG. 1.

A laser beam 15 generated by the semiconductor laser 1 exits the front side 3 of the semiconductor laser 1 in the direction of arrow A. However, the laser system 100 further includes a high frequency pulse generator 21. The High frequency pulse generator is configured to generate a high frequency pulse 23 that, in the example embodiment, travels in the direction of arrow B and is sufficiently wide enough so that it can be focused to cover an entire quantum well-formed inside the semiconductor laser 1.

The laser system 100 further includes two mirrors. The two mirrors 200AB are preferably formed in silicon when the silicon layers that form the semiconductors laser 1 are fabricated. These mirrors 200AB can have characteristics and properties as mentioned below. In other configurations, the mirrors can be optical mirrors fabricated separately from the silicon laser 1.

Having described the components of the laser system 100, its use and operation are now discussed. In operation, the example embodiment of the present invention is an ultra-fast semiconductor laser that uses a cavity dump technique utilizing plasma frequency up conversion. The laser system 100 operates as follows: the semiconductor laser 1 operates with high reflectivity mirrors (typically internal to the semiconductor laser 1) so that no output coupler is needed. The mirrors (which are generally internal to the semiconductor laser structure 1) have selective bandwidth over the gain region. When the semiconductor laser 1 is turned on, optical power begins to build up and is generally only limited by thermal considerations. Once intra-cavity optical power is sufficiently high, a pulse 23 with a rise time much faster than an optical cycle is generated by the high frequency pulse generator 21. This pulse is directed to impinge on a semiconductor laser junction internal to the semiconductor laser 1. The optical pulse 23 impinging has the characteristics that the frequency is sufficiently high that it is above the bandgap of the semiconductor ridge. The intensity is high enough that it will give enough plasma density, on ionization in the junction, to give a plasma frequency higher than the separation between the optical frequency and that of the edge of the mirror transmission. When the pulse 23 impinges on the laser junction the optical power in the laser cavity shifts in frequency from $f_{laser}$ to $f_{laser}+f_{plasma}$. Where $f_{plasma}$ is given by the square root of the following quantities:

For one photon absorption:

$$I*alpha*e^2/(2*pi^2*epsilon*m*h*f_{pulse})$$

For two photon absorption:

$$I^2*beta*e^2/(2*pi^2*epsilon*m*h*f_{pulse})$$

where e is the electron charge, $f_{pulse}$ is the optical frequency of the incoming ionizing pulse, I is the peak intensity, alpha and beta are the one and two photon absorptions respectively, epsilon is the dielectric constant of the laser medium, m is the electron mass, and h is Planck's constant.

When the shift is high enough to go beyond the reflectivity band of the mirror, the cavity will dump all photons out causing a high power pulse to be emitted with a frequency of $f_{laser}+f_{plasma}$. This pulse can then be coupled to a fiber or other optical device.

Referring to FIG. 1, this example configuration includes a Fabry-Perot cavity. In this case, a quantum well laser 23 (Arrow B) is injected from the side with a femto second beam which is focused to cover the entire quantum well. This causes a frequency shift and the IR beam 25 propagates out as shown (Arrow A). This case would be similar to a distributed Bragg reflector laser (DBR) where the gain area is illuminated.

An alternative example embodiment is a distributed feedback laser (DFB). In the case of a DFB laser, the approach is similar to that of FIG. 1, except that the reflector is distributed along the gain medium. In this case, no mirror is necessary and as the frequency shifts, the distributed Bragg reflector becomes transparent and allows the cavity dumping.

Useful background information relative to this invention may be included in S. C. Wilks, J. M. Dawson, W. B. Mori, "Frequency Up-Conversion of Electromagnetic Radiation with Use of an Overdense Plasma," Physical Review Letters Vol. 61, No. 3, pp. 337-340, 1988, the contents of which are incorporated herein by reference.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 2:
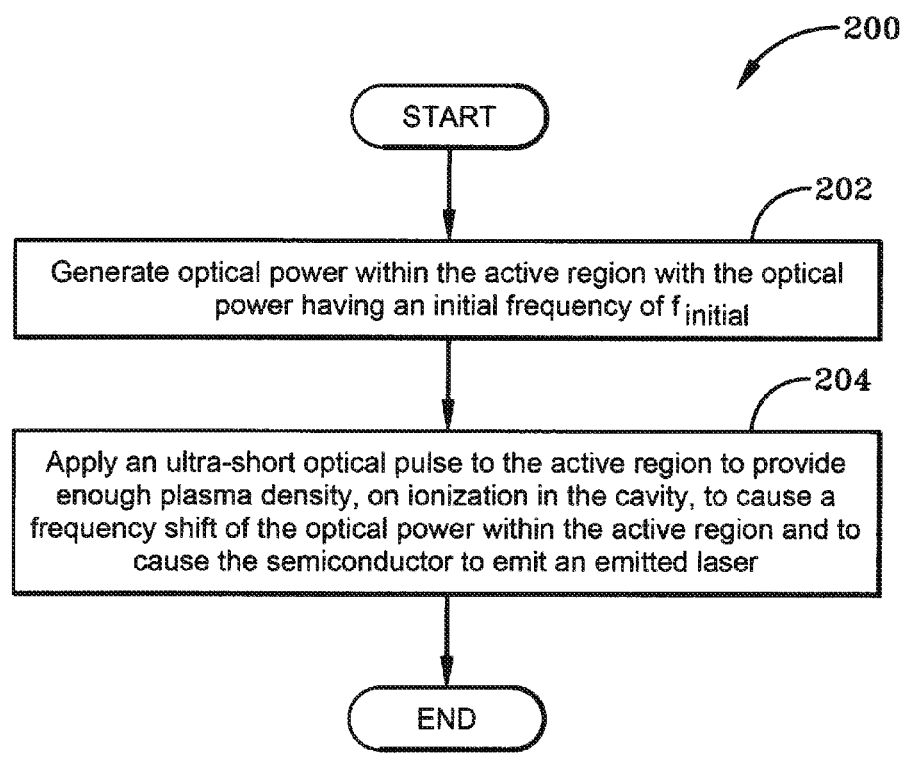
FIG. 2 illustrates an embodiment of a method for operating a semiconductor laser having 100% mirrors and a cavity having an active region.

FIG. 2 illustrates a method 200 for operating a semiconductor laser having 100% mirrors and a cavity having an active region. The method 200 begins by generating optical power, at 202, within the active region with the optical power having an initial frequency of $f_{initial}$. This optical power can be generated as describe above. Next, an ultra-short optical pulse is applied to the active region, at 204, to provide enough plasma density, on ionization in the cavity, to cause a frequency shift of the optical power within the active region and to cause the semiconductor to emit an emitted laser. This ultra-short optical pulse can be generated as described above. The frequency shift is a frequency of $f_{plasma}$, and the frequency of the emitted laser has a frequency of $f_{initial}+f_{plasma}$.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the example embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the example embodiment" does not necessarily refer to the same embodiment, though it may.

What is claimed is:

1. A laser system comprising:
    a first mirror and a second mirror;
    a semiconductor laser configured to generate an optical power within an optical cavity and to reflect the optical power between the first mirror and the second mirror, wherein the optical power has a frequency of $f_{original-laser}$;
    a high frequency pulse generator configured to generate a high frequency pulse with a rise time greater than an optical cycle generated by the high frequency pulse generator and to directly impinge the high frequency pulse onto the optical power within the optical cavity, wherein impinging the high frequency pulse on the optical power within the optical cavity causes a frequency shift of the optical power in the optical cavity to generate a final laser frequency that is greater than $f_{original\text{-}laser}$ as well as beyond a frequency band of the second mirror to cause a final laser to be emitted past the second mirror and from the semiconductor laser.

2. The laser system of claim 1 wherein the high frequency pulse generator is further configured to generate the high frequency pulse so that the high frequency pulse ionizes a material in the optical cavity to generate the final laser frequency.

3. The laser system of claim 1 wherein the high frequency pulse further comprises:
a frequency of $f_{pulse}$, and wherein the final laser frequency corresponds to:
$f_{original\text{-}laser} + f_{plasma}$, wherein $f_{plasma} = F(f_{pulse})$, where $F(f_{pulse})$ is a function dependent on $f_{pulse}$ and $f_{pulse}$ is an optical frequency of the incoming ionizing pulse.

4. The laser system of claim 3 wherein for a one photon absorption:

$$f_{plasma} = [I^* alpha^* e^2/(2^* pi^{2*} epsilon^* m^* h^* f_{pulse})]^{1/2},$$

where e is the electron charge, I is the peak intensity, alpha is the one photon absorption, epsilon is the dielectric constant of a laser medium, m is the electron mass, and h is Planck's constant.

5. The laser system of claim 3 wherein for a two photon absorption:

$$f_{plasma} = [I^{2*} beta^* e^2/(2^* pi^{2*} epsilon^* m^* h^* f_{pulse})]^{1/2},$$

where e is the electron charge, $f_{pulse}$ is the optical frequency of the incoming ionizing pulse, I is the peak intensity, beta is two photon absorption, epsilon is the dielectric constant of a laser medium, m is the electron mass, and h is Planck's constant.

6. The laser system of claim 3 wherein $f_{original\text{-}laser} + f_{plasma}$ is above a reflective bandwidth of the second mirror.

7. The laser system of claim 1 wherein the first mirror further comprises:
a first mirror that is 100 percent reflective at $f_{original\text{-}laser}$, and wherein the second mirror further comprises:
a second mirror that is 100 percent reflective at $f_{original\text{-}laser}$.

8. The laser system of claim 1 wherein the second mirror further comprises:
a selective bandwidth over a gain region.

9. The laser system of claim 1 wherein the optical cavity is a Fabry-Perot cavity.

10. The laser system of claim 1 wherein the semiconductor laser is a quantum well laser.

11. The laser system of claim 1 wherein the second mirror further comprises:

a second reflector distributed along a gain medium generating the optical power.

12. The laser system of claim 11 wherein the second reflector is a distributed Bragg reflector.

13. The laser system of claim 1 wherein the high frequency pulse generator further comprises:
the high frequency pulse generator is configured to transmit the high frequency pulse from one of the group of: a side of the semiconductor laser and above the semiconductor laser.

14. The laser system of claim 13 wherein the high frequency pulse generator is configured to transmit the high frequency pulse at a 90 degree angle to a direction that the final laser is emitted.

15. The laser system of claim 1 wherein the high frequency pulse further comprises:
a femtosecond beam that covers the entire optical cavity.

16. The laser system of claim 1 wherein the first mirror and second mirror further comprise:
the first mirror formed in a material forming the semiconductor laser; and
the second mirror formed in a material forming the semiconductor laser.

17. The laser system of claim 1 wherein the first mirror and second mirror further comprise:
a 100 percent reflecting first mirror at $f_{original\text{-}laser}$; and
a 100 percent reflecting second mirror at $f_{original\text{-}laser}$, wherein the laser system lacks an output coupler.

18. A method for operating a semiconductor laser having a cavity having an active region comprising:
generating an optical power within the active region with the optical power having an initial frequency of $f_{initial}$; and
applying an ultra-short optical pulse to the active region to provide enough plasma density, on ionization in the cavity, to cause a frequency shift of the optical power within the active region and to cause the semiconductor laser to emit an emitted laser, wherein the frequency shift is a frequency of $f_{plasma}$, and wherein the frequency of the emitted laser has a frequency of $f_{initial} + f_{plasma}$.

19. The method of claim 18 wherein the semiconductor laser is a quantum well laser and the step of applying the ultra-short optical pulse further comprises:
injecting quantum well laser from a side that is a femtosecond beam.

20. The method of claim 18 wherein the applying of the ultra-short optical pulse further comprises:
applying the ultra-short optical pulse that has a frequency that is sufficiently high that it is above a bandgap of a semiconductor ridge of the semiconductor laser.

* * * * *